United States Patent [19]

Tonnel

[11] 4,375,717

[45] Mar. 8, 1983

[54] PROCESS FOR PRODUCING A FIELD-EFFECT TRANSISTOR

[75] Inventor: Eugene Tonnel, Paris, France

[73] Assignee: Thomson-CSF, Paris, France

[21] Appl. No.: 167,391

[22] Filed: Jul. 8, 1980

[30] Foreign Application Priority Data

Jul. 10, 1979 [FR] France ............................ 79 17848

[51] Int. Cl.³ .................................................. H01L 21/26
[52] U.S. Cl. ................................. 29/571; 29/576B; 148/187; 148/188
[58] Field of Search ............. 29/571, 576 B; 148/187, 148/188

[56] References Cited

U.S. PATENT DOCUMENTS

| | | | |
|---|---|---|---|
| 3,912,557 | 10/1975 | Hochberg | 148/188 |
| 3,942,241 | 3/1976 | Harigaya et al. | 148/188 X |
| 4,181,542 | 1/1980 | Yoshida et al. | 148/187 |
| 4,190,466 | 2/1980 | Bhattacharyya et al. | 29/578 |
| 4,191,602 | 3/1980 | Baliga | 29/571 X |
| 4,322,882 | 4/1982 | Vora | 29/571 |

*Primary Examiner*—G. Ozaki
*Attorney, Agent, or Firm*—Cushman, Darby & Cushman

[57] ABSTRACT

The process of the invention allows, by placing a silicon nitride layer between a first silicon oxide layer developed on a silicon wafer and a second silicon oxide layer developed from polycrystalline silicon grid electrodes, a double self-alignment of the grid electrodes to be obtained which are used as a mask with respect to the channel-forming zones of the transistor and of these same grid electrodes used as a mask with respect to the connections for the source regions of this same transistor, the source regions being obtained by diffusion in the silicon wafer of the dopant of a doped polycrystalline silicon layer forming the connections of the source regions.

5 Claims, 10 Drawing Figures

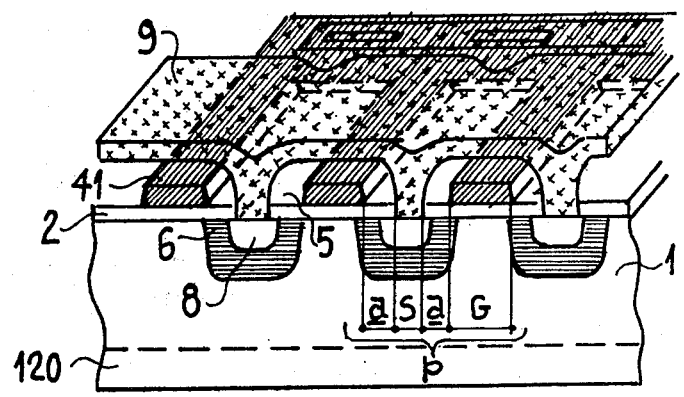
FIG_1
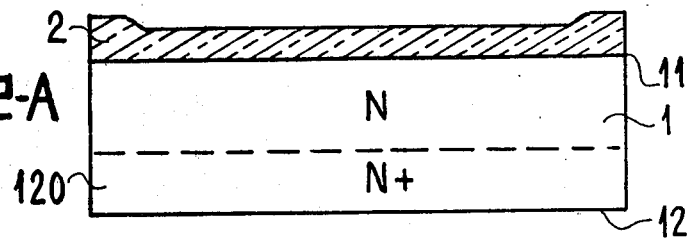
FIG_2-A
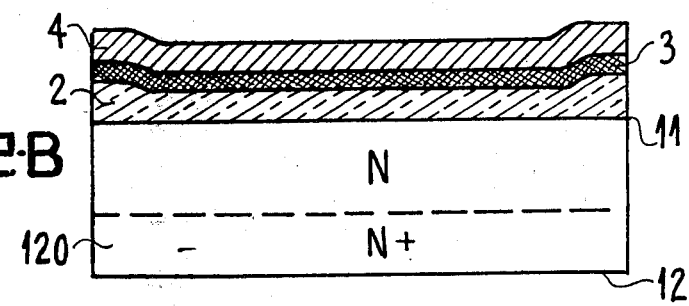
FIG_2B
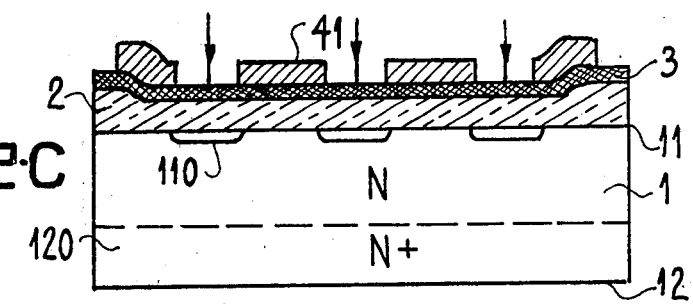
FIG_2C

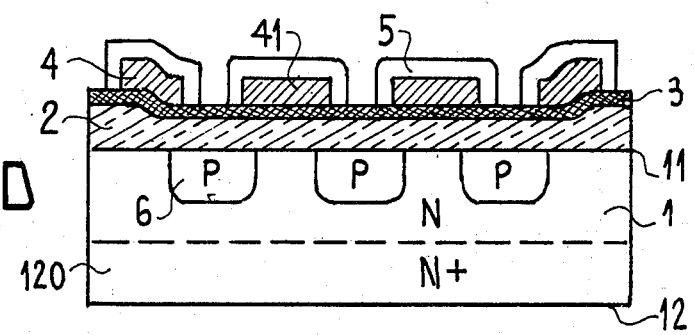
FIG_2·D
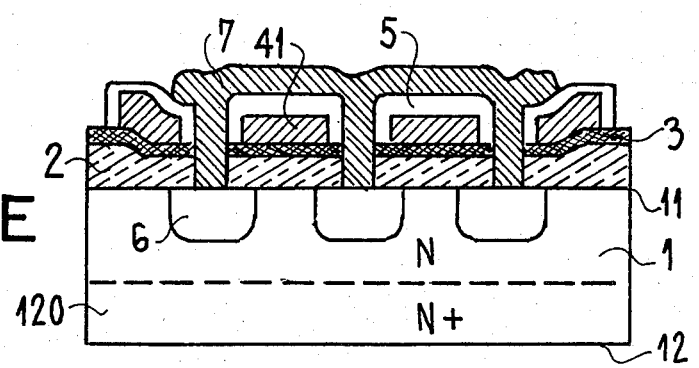
FIG_2·E
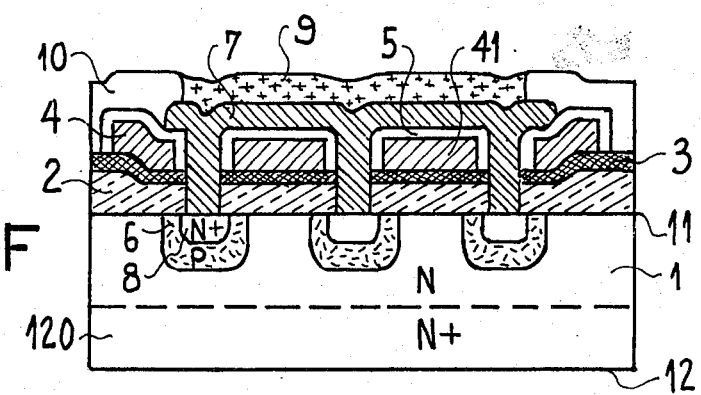
FIG_2·F

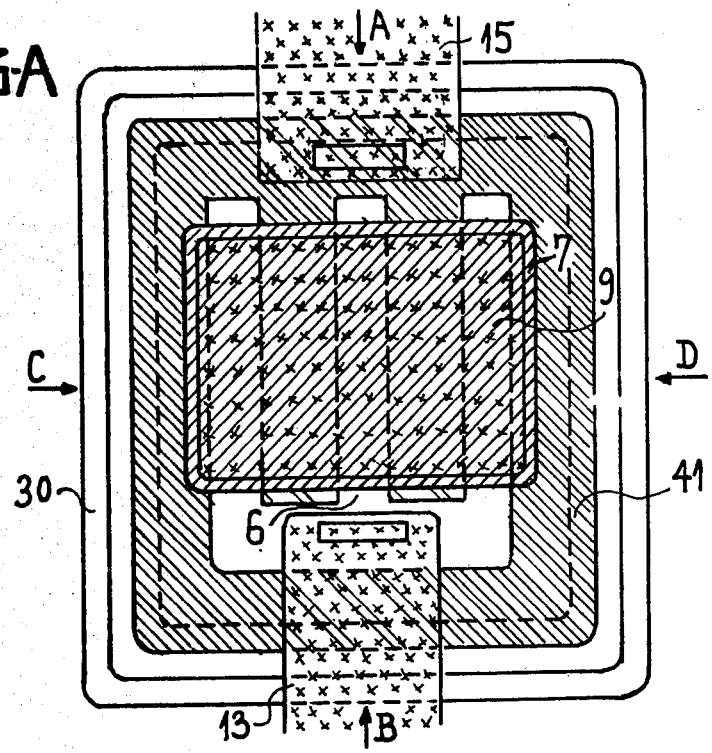
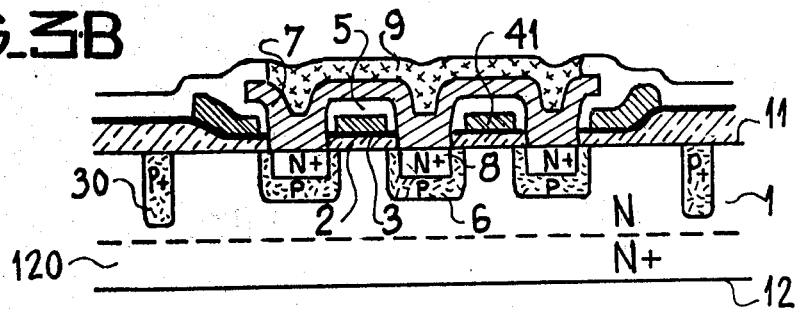
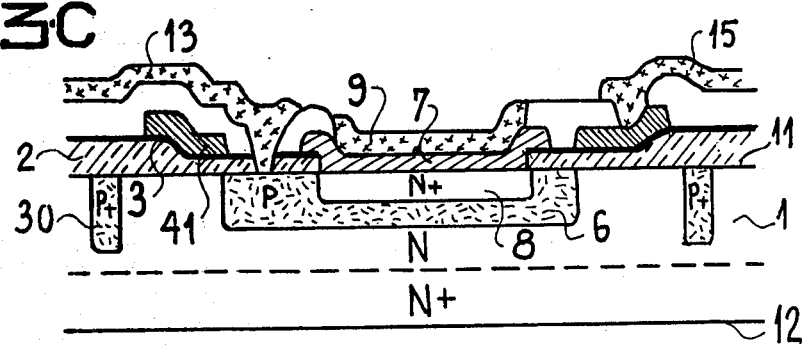

PROCESS FOR PRODUCING A FIELD-EFFECT TRANSISTOR

BACKGROUND OF THE INVENTION

The present invention relates to the field of semiconductor devices such as field-effect transistors of the "double diffused MOS" type known under the name "vertical operation DMOS" and intended to be used for power amplification or switching and more particularly to a process for manufacturing this type of transistor as well as the transistor obtained by this process.

Field-effect transistors have up to present been used principally as microcomponents in integrated circuits. The structure of such circuits was principally formed from symmetrical elements insulated from each other and having electrical performances adapted to the generally desired rapidity-consumption compromise.

However the characteristics proper to field-effect transistors, short cut-off time, linearity, high thermal stability, allow an increased field of application to be contemplated for these transistors reserved up to present for bipolar transistors particularly in the field of amplification, rapid switching and power switching or control.

Vertical-operation DMOS transistors such as shown in section in FIG. 1 comprise on a wafer of a semiconductor material 1, such as silicon, a structure formed from parallel fingers 41 forming the grid of the transistor, the grid being insulated from the wafer of semiconductor material by a silicon oxide layer 2. The parallel fingers 41 are formed by polycrystalline silicon. The wafer of semiconductor material 1 comprises, between the fingers forming the grid, interfitting zones 6 and 8 forming respectively the channel-forming zones and source regions of the transistor. By way of example, the silicon wafer has a type N conductivity, channel-forming zones 6 are diffused of type P and the source regions 8 are N+ doped. The silicon wafer also comprises a drain region 120 of N+ conductivity type and a metallization 9 insulated from the grid fingers 41 of a silicon oxide layer 5 developed by thermal growth from the polycrystalline silicon forming grid fingers 41. The metallization 9 forms the connection for the source regions.

As shown in FIG. 1, the structure, with respect to this type of transistor, is developed in the form of fingers perpendicular to the plane of this section. For a given dimension of these fingers in a direction perpendicular to the plane of this section, the conductance per unit area of such devices is inversely proportional to the pitch p of the network of interfitting fingers. This pitch is written $p = G + S + 2a$ where G is the lateral dimension of each finger, S the laterl dimension of the source contact and a the positioning tolerance of the source contact with respect to the grid electrode. In transistors of this type, the conductance per unit area is proportional to the lateral dimension of the channel-forming zone formed by the diffusions. For an interfitting structure, the lateral dimension of the channel-forming zone increases when pitch p of the structure decreases, the conductance per unit area being in this case limited particularly by the existence of the positioning tolerance a of the contact in relation to the grid.

The process of the invention aims at providing a field-effect transistor in which the positioning tolerances of the source contact are substantially abolished.

Another aim of the invention is to provide a process for manufacturing a field-effect transistor allowing improved control of the doping of the source region.

Another aim of the present invention is to provide by the abovementioned process a transistor of the vertical-operation DMOS type particularly adapted to power switching.

SUMMARY OF THE INVENTION

The process of the invention consists, starting with a silicon wafer of a first conductivity type comprising a first principal face and a second face opposite this first face, the zone of the wafer situated in the vicinity of the second face having conductivity of the same type as and greater than the conductivity of the wafer forming the drain of the transistor, in carrying out the following treatment steps:

forming by thermal growth a first silicon oxide layer of a given thickness on the first face of the substrate, forming on this first silicon oxide layer a layer of silicon nitride, depending on this silicon nitride layer a layer of doped polycrystalline silicon and opening this layer by masking and etching to form the grid electrodes of the transistor, forming by ionic implanation, by means of the mask formed by the grid electrodes, a doping having a type of conductivity opposite that of the water, heating so as to develop, from the polycrystalline silicon forming the grid electrodes, a second silicon oxide layer of a greater thickness than that of the first layer and to cause the dopant to diffuse and to form in the silicon wafer zones having a type of conductivity opposite that of the water, selective etching of the silicon nitride layer and etching of the silicon oxide over a thickness corresponding to that of the first layer so as to lay the wafer bare, depositing a second layer of doped polycrystalline silicon having the same type of conductivity as that of the zone of the wafer forming the drain of the transistor, heating so as to cause the dopant to diffuse from the second polycrystalline silicon layer into the underlying portions of the wafer to form the source zones of the transistor, opening the second polycrystalline silicon layer by masking for the grid and channel connections of the transistor.

Implementation of the process of the invention allows an insulated grid field-effect transistor of the vertical-operation DMOS power type to be obtained in which the grid electrode is separated from the first principal face of the silicon wafer by a superposed silicon oxide layer and a silicon nitride layer, the grid electrode being disposed directly on the silicon nitride layer, the connection electrically connecting each source region being formed by means of a layer of doped polycrystalline silicon having the same type of conductivity as the source regions of the transistor.

The field-effect transistor of the invention may be used for power switching or amplification, the conductance per unit area being increased by the order of 40% with respect to previously known structures.

The invention will be better understood from the following description and drawings where the same references show the same elements.

DESCRIPTION OF THE DRAWINGS

FIG. 1 shows a diagram relating to a DMOS transistor structure of the prior art.

FIG. 2 shows at 2A, 2B, 2C, 2D, 2E and 2F sectional views of the silicon wafer after different steps of the process of the invention.

FIGS. 3A, 3B, 3C show respectively a particular embodiment of the field-effect transistor of the invention in which, by way of example, three source regions have been shown.

FIGS. 3B, 3C show respectively a cross-section along C-D and a longitudinal section along A-B of the embodiment shown in FIG. 3A.

DESCRIPTION OF THE PREFERRED EMBODIMENT

FIG. 2 shows, following the principal steps referenced A to F, the processes for manufacturing a vertical-operation DMOS transistor in accordance with the invention. The manufacturing process will be described in accordance with FIG. 2, starting from a silicon wafer 1 of a first type of conductivity of type N for example. Any other mode of implementation of the process of the invention from a silicon wafer of type P conductivity does not depart from the scope of the present invention. The silicon wafer 1 comprises a first principal face 11 and a second face 12 opposite this first face. The zone situated in the vicinity of the second face has a conductivity of the same type as and greater than the conductivity of the wafer and forms the drain of the transistor. In FIG. 2, zone 120 situated in the vicinity of the second face is of type $N^+$. The process of the invention comprises the following steps.

In step A of FIG. 2, a first silicon oxide layer 2 is formed by thermal growth. This silicon oxide layer is formed on the first face 11 of the wafer in two different thicknesses, one thick of the order of 1 micron at the periphery of the wafer, and the other thin of the order of 0.1 micron in the active region of the element.

In step B there is formed on the first silicon oxide layer 2 a silicon nitride layer 3. The silicon nitride layer 3 is itself covered, by a layer of doped polycrystalline silicon 4 deposited thereon. The relative thicknesses of the silicon oxide and silicon nitride layers are chosen so as to minimize the mechanical stresses and the variation of the threshold voltage of the transistor likely to result from blockage of the grid. By way of example, for a silicon oxide thickness of 100 nanometers, a silicon nitride layer of 50 nanometers is sufficient. The thickness of the polycrystalline silicon layer 4 is chosen so as to ensure the thermal oxide growth for subsequently insulating the grid electrodes and so as to present a fairly low resistance per unit area so as not to reduce the switching time of the transistor. The polycrystalline silicon layer 4 is then opened by masking and by etching with a view to forming the grid electrodes of the transistor.

In step C, the layer of polycrystalline silicon 4 has been shown opened after etching, the grid electrodes being referenced 41. In step C implantation zones 110 are formed by ionic implantation of a dopant having a type of conductivity opposite that of the wafer by means of the mask formed by the grid electrodes 41. By way of example, in accordance with FIG. 2, the implanted dopant is boron. The implantation is carried out with sufficient energy to pass through the silicon oxide 2 and silicon nitride 3 layers.

In step D there was developed, by heating from the polycrystalline silicon forming the grid electrodes, a second silicon oxide layer 5 having a greater thickness than the first layer 2. Similtaneously, the dopant implanted in the implantation zones 110 forms, in the silicon wafer by diffusion, zones having a type of conductivity opposite that of the wafer. These zones are referenced 6 after step D and are zones of type P conductivity in the example of FIG. 2. The second silicon oxide layer 5 originated at the surface of the grid electrodes 41 at the time when oxidation of the wafer and the growth of the first silicon oxide layer 2 were prevented by the barrier of silicon nitride 3.

In step E, the silicon nitride layer 3 and then the silicon oxide layer were successively etched selectively and without an additional masking step, so as to bare the wafer between the grid electrodes. With the nitride layer etched, etching of the silicon oxide layer 2 is proceeded with while using the silicon nitride layer 3 as a mask. During this etching, the oxidized regions 5 of the grid electrodes not protected by the silicon nitride will also be etched. It is however possible to limit the etching time of the silicon oxide layer 2 to be eliminated to the minimum required and to ensure a compromise between the relative thickness of the first silicon oxide layer 2 to be eliminated and the fraction of the polycrystalline silicon oxide layer 5 to be kept. The successive etching of the first silicon oxide layer and of the silicon nitride layer is followed by depositing a second layer of doped polycrystalline silicon 7 having the same type of conductivity as that of zone of the wafer forming the drain of the transistor. In the non-limiting embodiment of FIG. 2, the second layer of polycrystalline silicon is $N^+$ doped. During this step, in the parts of the wafers which do not have any grid, a reservation is made by means of a resin mask to establish a localized contact with the channel-forming zone. This is not visible in FIG. 2E but will appear particularly with respect to FIGS. 3B and 3C. In step F, heating allowed the dopant of the second polycrystalline silicon layer 7 to diffuse into the underlying portions of the wafer for forming the source zones 8 of the transistor. The channel-forming zones of the transistor are delimited, on the one hand, by the diffusion zone of the implantation zones and, on the other hand, by the diffusion zone of the dopant of the second polycrystalline silicon layer 7. A step for opening the second polycrystalline silicon layer allows, by masking the positioning tolerance of which is not critical, the grid connections and the channel of the transistor to be effected. The first polycrystalline silicon layer 4 may without disadvantage be doped $N^+$ or $P^+$, the nature of the N or P dopant arising solely taking into account the difference of the corresponding Fermi levels for the value of the grid voltage applied to the transistor to ensure operation thereof. The first polycrystalline silicon layer 4 may be doped, either during depositing, or after depositing thereof, this depositing being able to be carried out at low pressure by silane decomposition at a temperature close to 600 degrees. According to a particular embodiment of the process of the invention, the step for opening the second polycrystalline silicon layer 7 is preceded by depositing a third layer of doped silicon oxide 10 having the same type of conductivity as this second polycrystalline silicon layer. In the example of FIG. 2, the third silicon oxide layer is doped with phosporus. This layer is then flowed at a high temperature before opening the contacts at right-angles to the source, channel-forming and grid regions.

High-temperature flowing of the third silicon oxide layer levels down the sharp edges of the contact openings at right-angles to the source, channel and grid regions. These regions are then connected by means of metallizations 9. The process of the invention allows field-effect transistors to be obtained having a much improved conductance per unit area because of the use twice over of processes for self-aligning of the contacts, thus abolishing the most critical positioning tolerances. In fact, a first self-alignment of the grid electrodes with respect to the channel-forming zone is obtained by the use of the grid electrodes as an implantation mask. A second self-alignment of the contacts and of the source region of the transistor with respect to the grid electrode allows in particular the positioning tolerance of the source contacts to be abolished with respect to this grid, except for the thickness of silicon oxide insulating the grid electrodes, because of the formation of the source zones by diffusion from the second polycrystalline silicon layer, the grid electrodes being again used as a mask. The process used allows the greatest possible lateral dimension of channel to be obtained per unit area. In the case of a structure having interfitting sources and grids, pitches of 10 microns can be obtained with conventional optical photo-etching techniques. In the case of production of high-power transistors, a double-layer arrangement of the source and grid electrodes allows easy interconnection between the different electrodes. For elements working under a low voltage, it is further possible to reduce the pitch by reducing the grid width. Thus, with better-adapted photo-etching processes, pitches of the order of 5 microns can be obtained. Such a technique allows a gain in conductance per unit area by a factor of 5 with respect to present elements and is capable of permitting performances better than those of bipolar elements.

FIG. 3A shows in a top view an insulated-grid field-effect transistor of the invention. FIGS. 3B, 3C show respectively a cross-section along C-D of FIG. 3A and a longitudinal section along A-B of the same figure. The embodiment of a field-effect transistor in accordance with the invention shown in FIGS. 3A to 3C is given by way of example, the example concerning an interfitting type of structure comprising only three fingers for the sake of simplicity. In this example, the transistor will be described in the case where the silicon wafer is a wafer of N-type doped silicon. Any embodiment in which the silicon wafer is a wafer of a P-type doped silicon, for example, does not depart from the scope of the present invention.

The field-effect transistor of the invention comprises a silicon wafer 1 of a first conductivity type comprising a first face 11 and an opposite second face 12 and a drain region 120 situated in the vicinity of the second face and having a conductivity higher than, and of the same type as, the conductivity of the wafer. The transistor comprises at least two interfitting zones flush with the surface of the first face 11 and each comprising a first and second zone whose conductivity is respectively of the same type as and of the opposite type to the type of conductivity of the wafer. In FIGS. 3A, 3B, 3C, the first and second zones having the same type of conductivity and the opposite type of conductivity to that of the wafer are referenced respectively 8 and 6. The second zone 6 separates the first zone 8 from the drain region 120 for each interfitting zone. Each first zone 8 forms a source region of the transistor. The first face of wafer 11 comprises, disposed between each transistor source region, a doped polycrystalline silicon grid electrode 41 covered with a silicon oxide layer 5. Grid electrode 41 is separated from the first face of the silicon wafer 11 by a silicon oxide layer 2 and a silicon nitride layer 3 superposed on each other. The grid electrode is disposed directly on the silicon nitride layer. The connection 9 electrically connecting each source region is formed by means of a doped polycrystalline silicon layer 7 having the same type of conductivity as the source regions of the transistor. In the embodiments of FIGS. 3A to 3C there can be seen in these figures a guard ring 30 of type P+, not connected in accordance with the embodiment of FIGS. 3A to 3C and shown by a single ring. This guard ring may in fact be formed of a series of concentric rings in the case of devices operating at a very high voltage. The grid of transistor 41 forms a frame in which is inscribed the E-shaped channel-forming zone 6. This channel-forming zone is diffused with type P in the silicon wafer. The N+ doped source regions 8 in the embodiment of FIGS. 3A to 3C form the fingers laterally aligned with the edge of grid 41. The source regions 8 are connected by a second polycrystalline silicon layer 7 from which the source regions have been formed by diffusion. The second polycrystalline silicon layer 7 is insulated from grid 41 by a silicon oxide layer 5 obtained by oxidization of the polycrystalline silicon forming this grid. The polycrystalline silicon layer 7 does not cover the part of the channel-forming zone which will be used for providing contact with the channel region. The connection 13 of the channel and 9 of the source are shown insulated but may be connected, particularly when the transistor is used as a discrete component. The grid 41 is connected by connection 15, either to an output, or to a protecting diode which may be diffused on the same silicon wafer. This diode, not shown, may be formed with the source-channel diode of the transistor and located for example at the periphery of the silicon wafer. The structure of the transistor shown in FIG. 3A only comprises three source fingers, transistors with high conductance being obtainable, without departing from the scope of the present invention, by disposing in parallel several sources inside the same grid frame. The number of sources in parallel as well as the length of the fingers are determined by the limit resistance allowed for the channel and the grid of the device. In the case of using integrated-type field-effect transistors, in accordance with the process of the invention, the drain contact is taken on the front face or first face of the wafer by deep diffusion or by means of a sunken layer in accordance with the bipolar integrated circuit technique. In the case of an embodiment according to FIGS. 3A to 3C, the deep diffusion and the sunken layer are of type N+. Likewise, each source region with type N+ conductivity is for example doped with arsenic or phosphorus. In the field-effect transistors of the invention, the contact on the source regions is provided by means of the second polycrystalline silicon layer. The presence of polycrystalline silicon between the source regions and the contact metallizations avoids the migration of the silicon from the source into the contact metallizations and ensures that the contact stands up better to high-power operation. The field-effect transistor thus described may be protected by a passivation layer and completed by metal bosses for providing the connections to the external circuits.

What is claimed is:

1. A process for manufacturing a field-effect transistor of the vertical-operation DMOS type, from a silicon wafer having a first type of conductivity comprising a principal first face and a second face opposite this first face, the zone of the wafer situated in the vicinity of the second face presenting a conductivity of the same type as, and greater than, the conductivity of the wafer, forming the drain of the transistor, comprising the following steps:

forming, by thermal growth, a first silicon oxide layer of given thickness on the first face of the wafer, forming, on the first silicon oxide layer, a layer of silicon nitride, depositing, on the silicon nitride layer, a layer of doped polycrystalline silicon and opening this layer by masking and etching to form the grid electrodes of the transistor, forming implantation zones by ionic implantation of a dopant having a type of conductivity opposite that of the wafer by means of the mask formed by the grid electrodes, heating so as to develop, from the polycrystalline silicon forming the grid electrodes, a second silicon oxide layer whose thickness is greater than that of the first layer and so as to cause the implanted dopant to diffuse and form in the silicon wafer zones with a type of conductivity opposite that of the wafer, selectively etching the silicon nitride layer and etching the silicon oxide over a thickness corresponding to that of the first silicon oxide layer so as to bare the wafer, depositing a second layer of doped polycrystalline silicon having the same type of conductivity as that of the zone of the wafer forming the drain of the transistor, heating to cause the dopant of the second polycrystalline silicon layer to diffuse into the underlying portions of the wafer so as form the source zones of the transistor.

2. The process as claimed in claim 1, wherein the silicon wafer has N-type conductivity, the zone of the wafer situated in the vicinity of the second face forming the drain of the transistor having N+-type conductivity, the implanted dopant forming zones of P-type conductivity, and the second polycrystalline silicon layer being N+ doped.

3. The process as claimed in claim 2, wherein the first polycrystalline silicon layer is N+ doped.

4. The process as claimed in claim 2, wherein the first polycrystalline silicon layer is P doped.

5. The process as claimed in claim 2, wherein the second polycrystalline silicon layer is doped with arsenic.

* * * * *